United States Patent
Rogers

(10) Patent No.: US 6,655,286 B2
(45) Date of Patent: Dec. 2, 2003

(54) METHOD FOR PREVENTING DISTORTIONS IN A FLEXIBLY TRANSFERRED FEATURE PATTERN

(75) Inventor: John A. Rogers, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 23 days.

(21) Appl. No.: 09/967,343

(22) Filed: Sep. 29, 2001

(65) Prior Publication Data

US 2003/0041762 A1 Mar. 6, 2003

Related U.S. Application Data

(60) Provisional application No. 60/262,821, filed on Jan. 19, 2001.

(51) Int. Cl.$^7$ ................................................. B41K 1/00
(52) U.S. Cl. ........................ 101/485; 101/483; 101/109
(58) Field of Search ................................. 101/483, 485, 101/486, 109

(56) References Cited

U.S. PATENT DOCUMENTS

| | | | | |
|---|---|---|---|---|
| 4,098,184 A | * | 7/1978 | Okada et al. | 101/41 |
| 5,205,210 A | * | 4/1993 | Mathis | 101/32 |
| 5,641,372 A | * | 6/1997 | Okuno | 156/230 |
| 5,925,259 A | * | 7/1999 | Biebuyck et al. | 216/2 |
| 6,413,790 B1 | * | 7/2002 | Duthaler et al. | 438/21 |

* cited by examiner

Primary Examiner—Ren Yan
Assistant Examiner—Jill E Culler
(74) Attorney, Agent, or Firm—David W. Herring, Jr.

(57) ABSTRACT

A method for transferring an inked feature pattern from a stamp to a substrate is disclosed wherein the stamp and/or substrate is flexed into a cylindrical or approximately cylindrical surface before being contacted with each other. The stamp and substrate are contacted and at least one line of contact is advanced across the surface of the stamp in order to transfer the feature pattern from the stamp to the substrate.

12 Claims, 3 Drawing Sheets

METHOD FOR PREVENTING DISTORTIONS IN A FLEXIBLY TRANSFERRED FEATURE PATTERN

CROSS-REFERENCE

This application claims the benefit of U.S. Provisional Application, Ser. No. 60/262,821, filed Jan. 19, 2001 and titled "Method for Flexibly Transferring A Feature Pattern From an Inked Surface To A Substrate."

FIELD OF THE INVENTION

The present invention is related to transferring a feature pattern from an inked surface to a substrate.

BACKGROUND OF THE INVENTION

There has been a growing need in many fields for a method of accurately transferring a detailed feature pattern from one surface to another. Such feature patterns may be inked with patterning ink and then transferred from feature pattern stamps to a surface by using a transfer process wherein an inked stamp and the surface are contacted. An example of the use of such transfers is in the production of thin, lightweight electrophoretic displays. Such displays comprise a plane of interconnected transistors on a flexible (e.g., plastic) substrate that is placed underneath a layer of cells filled with electrophoretic display ink. When current is passed through a transistor underneath a specific ink cell, the perceived color of the ink in that cell changes, e.g., from black to white, allowing images to be displayed.

In producing such displays, various feature patterns must be created on various substrates to, for example, define a pattern of resist material that establishes an etch pattern (e.g., for etching the cells to hold ink), define a pattern of transistors, or interconnect the transistors together via conductive material. As the individual features of such feature patterns become smaller and more closely spaced in order to increase the resolution of the electrophoretic display, for example, reducing distortions to those features occurring during the transfer process becomes more critical.

Typical stamps for such applications utilize a material with a high number of pores (e.g., less than a few nanometers in diameter), which hold the patterning ink. This small pore size is required to transfer relatively fine feature details. Additionally, such stamps are highly conformable to surfaces they contact and are thus able to accurately transfer the fine feature details to the surface that is to be printed. A material typically used that exhibits such desired pore size and conformability is polydimethylsiloxane. However, because of the relatively low elastic modulus of polydimethylsiloxane, as the substrate is brought into contact with the stamp, the pressure exerted during the contact causes portions of the stamp feature patterns to shift when in contact with the substrate, thereby distorting the pattern when transferred from the stamp to the substrate. Such distortion can render the transferred feature pattern unusable.

Another problem encountered in transferring feature patterns from a stamp to a substrate is dust adhering to either the stamp or the substrate. If dust particles adhere in sufficient number in critical locations on the stamp or substrate, the ink will not be transferred to the substrate at those locations, resulting in significant defects in the transferred feature pattern. Prior methods of removing dust from the stamp include such measures as directing forced air over the stamp or substrate. Such methods were adequate in the prior art.

Previous methods of transferring a feature pattern can also create defects and distortions resulting from air bubbles trapped between the stamp and the substrate. One typical prior art method, represented in FIG. 1, involves simply lowering the substrate 101 onto the stamp 102 (or vice versa) in an attempt to bring the entire feature pattern 103 on stamp 102 into contact with the substrate at one time. Since air may not be able to escape from all locations between the stamp and the substrate, air bubbles of various sizes may form. As a result, the feature pattern may not transfer to the substrate at the air bubble locations. FIG. 2 shows another prior art method wherein the substrate 201 is brought into contact with one edge 203 of the stamp 202. The raised end of the substrate 201 is then lowered in direction 204 ultimately bringing the feature pattern 205 into contact with the substrate 201. This method can also result in trapped air bubbles.

SUMMARY OF THE INVENTION

The inventor has recognized that the aforementioned problem of the presence of air bubbles between the stamp and the substrate can be overcome by flexing the stamp or substrate during the transfer of the feature pattern on the stamp to the substrate. It is preferable to form a cylindrical, or approximately cylindrical, surface that is convex toward either the substrate or the inked surface of the stamp, respectively. For example, in the case where the substrate is flexed, at least one point of the substrate is brought into contact with at least one point on the stamp and the substrate is then partially unflexed to create a line of contact between the feature pattern and the stamp. The substrate is then permitted to flatten progressively across the stamp surface. A line of contact between the substrate and the stamp advances across the stamp surface, with full contact between the substrate and the stamp being achieved at all points behind the advancing line of contact. It is beneficial to slightly raise the side edges of the substrate, thereby introducing a slight saddle shape, i.e., a very small additional convexity of the substrate toward the stamp that runs perpendicular to the main convexity. Thus the advancing line of contact tends to begin in its own center portion and to advance both along and perpendicular to the direction of advancement. A similar procedure could be used in the case where the stamp is flexed, with the roles of the stamp and the substrate, in the procedure described hereinabove being reversed. An alternative to this method is to roll a cylindrical substrate across the surface of the stamp (or vice versa). In this method, the cylinder is contacted with the stamp and is rolled across the feature pattern on the stamp. Once again, a similar procedure could be used where a cylindrical stamp is rolled across a substrate. Any of the aforementioned methods greatly reduce the likelihood that air bubbles will form between the substrate and the stamp.

The method of transferring a feature pattern described hereinabove may appear, at first glance, to be a straightforward expedient. Indeed, similar methods have been used, for example, to reduce buckling when installing products such as plastic laminate. In installing such products, it was previously realized that rolling the product onto a surface would prevent unwanted premature contact between specific areas of the product and specific areas of the underlying surface to which adhesive may have already been applied. However, the problem solved by the present invention is not that of preventing such premature contact but is, rather, preventing air from becoming trapped between the substrate and the features of the stamp. In such situations, removing all air from underneath the product was not intended and was not necessary. In fact, air does become trapped beneath the plastic laminate, but in small enough quantities that the rigidity of the plastic laminate makes such air pockets visually and functionally unapparent. However, the features on the feature pattern of the stamp used in accordance with the present invention are in many cases smaller than 100 μm in at least one lateral dimension. It was left to the present inventor to discover that, by flexing the substrate in the manner described hereinabove, sufficient air is removed from underneath the substrate to permit the very high degree of surface contact required to transfer such small features from the feature pattern on the stamp to the substrate.

Solutions to the other problems mentioned above are disclosed herein and are the subject of my copending U.S. patent applications Ser. No. 09/967,342 and Ser. No. 09/966,883, titled "Method for Removing Unwanted Particles From a Surface Used in the Process of Flexibly Transferring a Feature Pattern from an Inked Surface to a Substrate," and "Method for Preventing Distortions in a Flexibly Transferred Feature Pattern," filed of even date herewith.

DETAILED DESCRIPTION OF THE INVENTION

Figure 1:
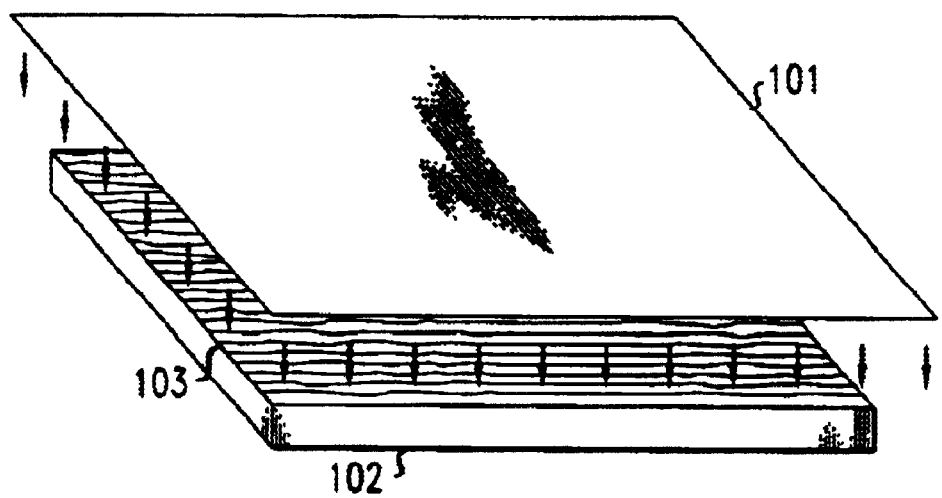
FIG. 1 shows a prior art method of transferring a feature pattern from a stamp to a substrate wherein the entire pattern is brought into contact with the substrate at one time.
Figure 2:
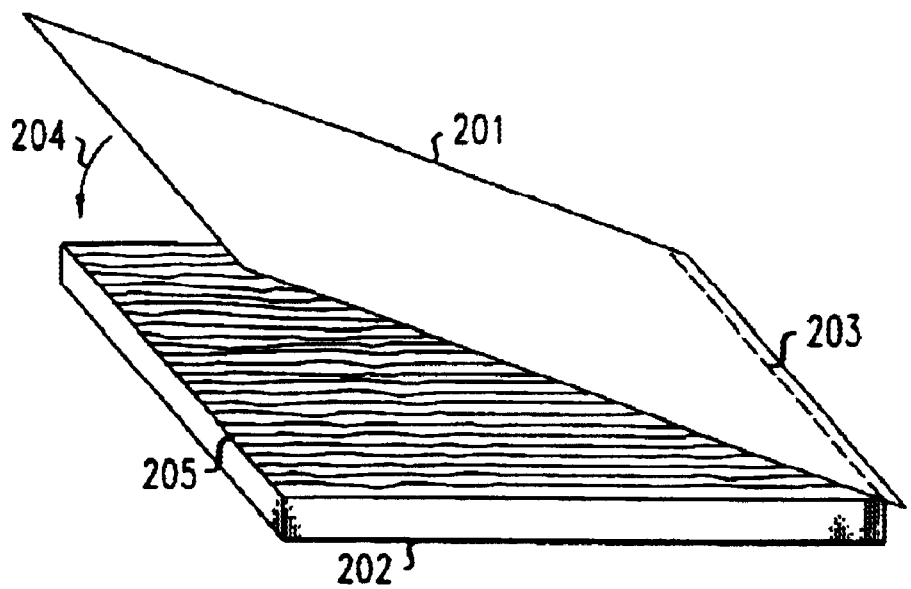
FIG. 2 shows a prior art method of transferring a feature pattern to a substrate wherein the substrate is first brought into contact with one edge of the stamp.
Figure 3:
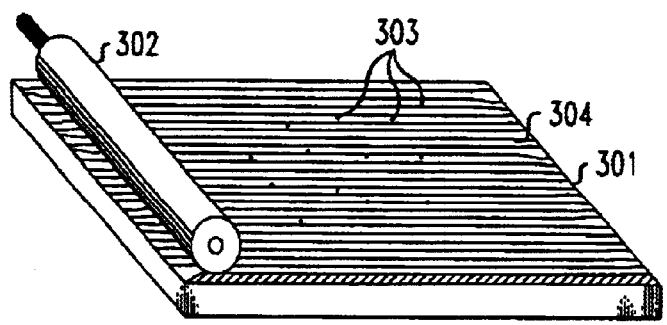
FIG. 3 shows a method wherein, before the feature pattern is inked, dust is removed from the stamp.

FIG. 3 shows an embodiment in accordance with the invention set forth in the above cited patent application, titled "Method for Removing Unwanted Particles From a Surface Used in the Process of Flexibly Transferring a Feature Pattern from an Inked Surface to a Substrate," wherein, prior to transferring ink from the feature pattern 304 on stamp 301, dust 303 is removed from the stamp. To remove the dust from feature pattern 304, roller 302 is rolled over stamp 301. Roller 302 is, for example, an adhesive-tape lint remover. However, any adhesive surface that can remove dust and other particles in a similar manner is suitable. Dust 303 adheres to the surface of the roller 302 and is thus removed from stamp 301. A similar procedure can be used to remove dust particles from the substrate to which transfer of the feature pattern 304 is desired.

Feature pattern 304 is illustrated for simplicity as a series of regularly spaced parallel features. However, feature patterns of various complexities may also be used. Features on the feature pattern, as used herein, are defined as those individual elements of the feature pattern that are intended to be transferred to the substrate and result in a functional part of the transferred feature pattern.

Figure 4:
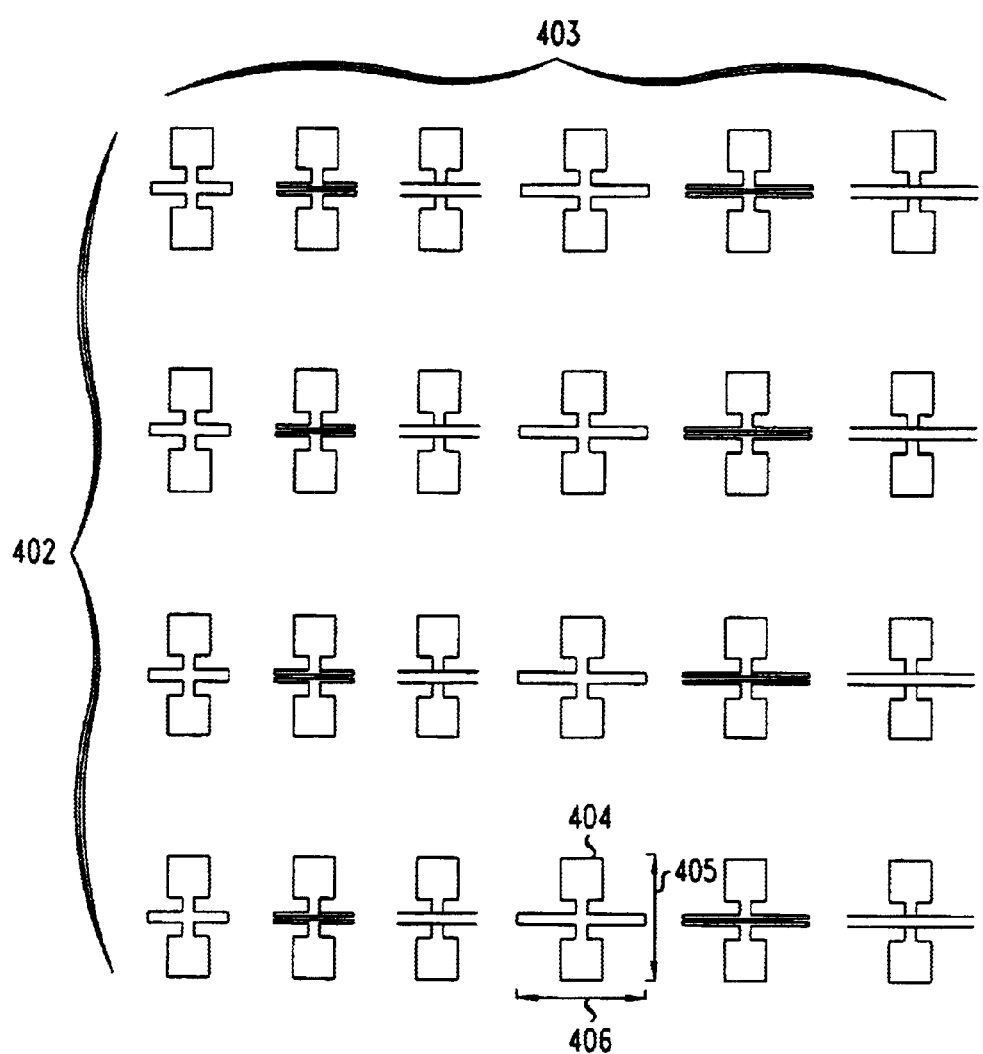
FIG. 4 shows a method of the present invention wherein, before the substrate is brought into contact with the stamp, the substrate is flexed into a saddle shape.

FIG. 4 shows an embodiment in accordance with the present invention wherein the features on the feature pattern stamp (or a portion of the stamp) are parts of individual transistors arranged in a grid with rows 402 and columns 403. Many other arrangements of the features other than a grid are possible. Illustratively, each transistor in the grid of FIG. 4, such as transistor 404, has, among other dimensions, lateral dimensions such as length 405 and width 406. The method of the present invention is suitable for use with the features of FIG. 4, even when those features are very small, e.g., where at least one of lateral dimensions 405 and 406 is less than 100 μm.

Figure 5:
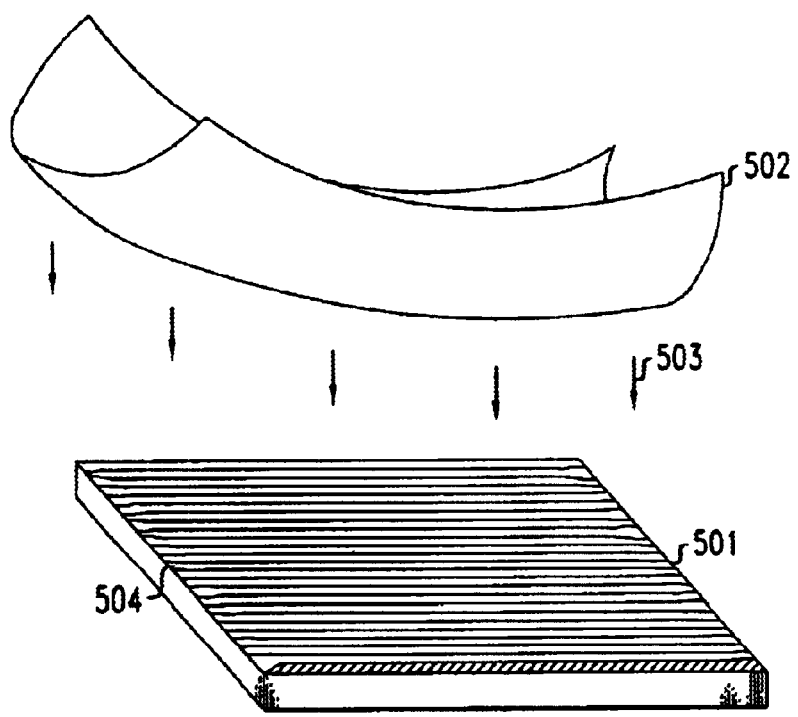
FIG. 5 shows the method of FIG. 4 wherein, in accordance with the present invention, the substrate is progressively unflexed in such a way that a line of contact advances across the stamp surface.

FIG. 5 shows an embodiment in accordance with the present invention wherein the substrate 502 to be imprinted with the feature pattern on stamp 501 is flexed prior to being lowered in direction 503 to make contact with feature pattern 504. Illustratively, the features on stamp 501 are smaller than 100 μm in at least one lateral dimension. The substrate 502 is flexed axially to form a cylindrical, or approximately cylindrical, surface that is convex toward the stamp. It is beneficial to slightly raise the side edges of the substrate, thereby introducing a slight saddle shape, i.e., a very small additional convexity of the substrate toward the stamp that runs perpendicular to the main convexity. An alternate method of applying the substrate to the feature pattern on the stamp would be to wrap the substrate around a cylindrical roller and roll the substrate across the feature pattern. An exemplary substrate useful in producing electrophoretic displays is a sheet of Mylar® material overcoated with desired layers, such as a layer of the material to be patterned by etching.

One advantageous feature of Mylar material is that it has a relatively high Young's modulus and also has a low flexural rigidity in the dimensions used herein (e.g., a thin substrate) such that the material can be flexed relatively easily. Young's modulus, also known as the elastic modulus, describes the elasticity of a material. A material, such as Mylar material, with a high Young's modulus can be flexed with less distortion to the features on the surface of the material than a material with a low Young's modulus. Flexural rigidity defines the resistance of a material to flexing. A material with relatively low flexural rigidity, such as thin substrate of Mylar material, can be flexed with relative ease.

As a consequence of the aforementioned high elastic modulus and low flexural rigidity, features on the pattern-receiving surface of a Mylar material substrate are not substantially distorted during flexure of the substrate. If a substrate with a low elastic modulus is flexed in this manner to facilitate the transfer of a feature pattern, the feature pattern would be distorted during the pattern transfer process. In the case of the substrate 502, flexing the substrate will not substantially distort the feature pattern during the pattern transfer process.

The hereinabove described transfer of a feature pattern can also be accomplished by flexing a stamp (rather than the substrate) and then contacting the stamp and the substrate. This can be accomplished by reversing flexural rigidity properties of the stamp and the substrate, i.e., so the stamp has a low flexural rigidity relative to the substrate. Thus, the same transfer method described hereinabove may be affected by flexing the stamp in a saddle or other shape, or the stamp may be applied to a cylindrical roller and rolled over a relatively rigid substrate.

Figure 6:
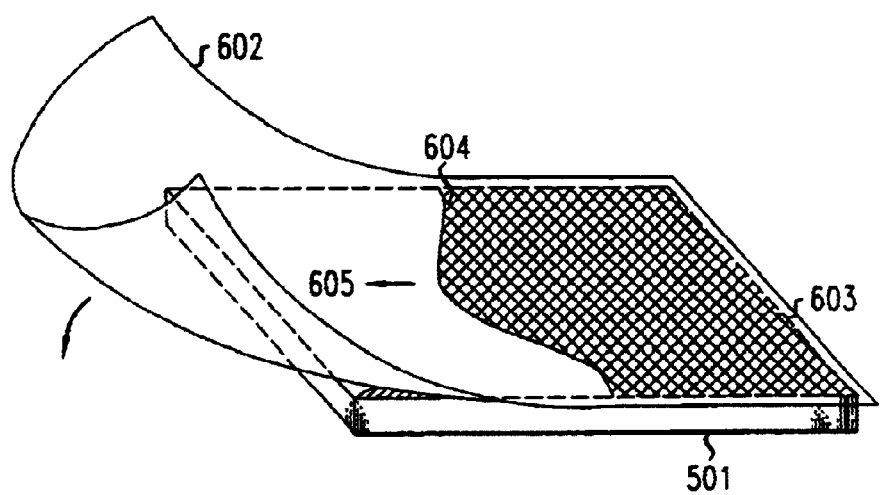

FIG. 6 shows an embodiment in accordance with the present invention wherein the substrate 602 is brought into contact with the feature pattern 504 in FIG. 5 on stamp 501 in an advantageous manner. After the substrate 602 has been flexed into a saddle shape as described above, it is brought into contact with at least one point along edge 603 of the inked surface of the stamp and is then partially unflexed to create a line of contact with edge 603. The substrate is then permitted to flatten progressively across the stamp surface. The flexural rigidity of stamp 501 may advantageously be higher than the substrate 602. Flexural rigidity is a function of both the Young's (elastic) modulus and the physical dimensions of a material and is related to how easily that material is flexed. By having a stamp 501 with significantly high elastic modulus it will not distort when the substrate is brought into contact with the feature pattern 504 in FIG. 5. Thus, the features on the stamp 501 will not shift and will be transferred accurately to the substrate 602.

A line of contact 604 between the substrate 602 and the stamp 501 advances across the stamp surface in direction 605, with full contact between the substrate and the stamp being achieved at all points behind the advancing line of contact 604. A similar procedure is used in the case where the stamp is flexed, with the roles of the stamp and the substrate, as used in the procedure described hereinabove, being reversed.

The foregoing merely illustrates the principles of the invention. It will thus be appreciated that those skilled in the art will be able to devise various arrangements that, although not explicitly described or shown herein, embody the principles of the invention and are within its spirit and scope. For example, while the embodiments disclosed above show either the stamp or the substrate having a low flexural rigidity and being unflexed after being brought into contact with a relatively higher flexural rigidity surface, both may in fact have a relatively low flexural rigidity. This would allow, for instance, both the stamp and the substrate to be formed in a cylinder and brought into contact with each other. By then rolling the cylinders as they remained in contact, the feature pattern would be transferred to the substrate. Any use of the hereinabove fine-feature printing method wherein at least one of the stamp and the substrate are of relatively low flexural rigidity is intended to be encompassed by the present invention.

Additionally, in the embodiments described hereinabove, flexing the stamp or substrate is described as a method of contacting a portion of the stamp and a portion of the substrate. In these described methods, the line of contact is progressively advanced across the stamp from one side to the other. However, other methods of bringing about such advancing contact are conceivable. For example, the stamp (or, alternatively, the substrate) may be flexed in a convex manner such that the center portion of the stamp (substrate) contacts the center portion of the substrate (stamp). By then progressively flattening the stamp (substrate), the area of contact between the stamp and the substrate would grow larger by progressively radiating in all or some directions from the center of the substrate (stamp) along the surface of the substrate (stamp). Any such method of flexing either the stamp or substrate and bringing about such advancing contact is intended to be encompassed by the present invention.

Furthermore, all examples and conditional language recited herein are intended expressly to be only for pedagogical purposes to aid the reader in understanding the principles of the invention and are to be construed as being without limitation to such specifically recited examples and conditions. Diagrams herein represent conceptual views of feature pattern stamps and substrates used for the purposes of transferring those feature patterns to the substrate. Diagrams are not necessarily shown to scale but are, instead, merely representative of possible physical arrangements of the components represented therein.

What is claimed is:

1. A method for use in transferring a feature pattern from a stamp to a substrate, said method comprising:

flexing at least one of the substrate and the stamp;

contacting at least one line of contact between said substrate and said stamp; and progressively advancing the at least one line of contact between said stamp and said substrate across at least one inked feature on the feature pattern of said stamp in a way such that an area of contact between said stamp and said substrate increases as said at least one line of contact advances, said at least one inked feature being of a size less than 100 $\mu$m in at least one lateral dimension.

2. The method of claim 1 wherein the step of progressively advancing the at least one line of contact comprises unflexing said at least one of the substrate and the stamp in a way such that said at least one of the substrate and the stamp flattens as it unflexes.

3. The method of claim 1 wherein said at least one of the substrate and the stamp is flexed axially to form a convex surface.

4. The method of claim 1 wherein the flexural rigidity of said at least one of the substrate and the stamp is such that flexing said at least one of the substrate and the stamp results in substantially distortion-free transfer of said feature pattern.

5. The method of claim 1 wherein the step of flexing at least one of the substrate and the stamp comprises the step of flexing the substrate.

6. The method of claim 1 wherein said substrate is a polyester film.

7. A method for use in transferring a feature pattern from a stamp to a substrate in the manufacture of an electronic system, said method comprising:

flexing at least one of the substrate and the stamp;

contacting at least one line of contact between said substrate and said stamp; and progressively advancing the at least one line of contact between said stamp and said substrate across at least one surface of the stamp in a way such that an area of contact between said stamp and said substrate increases as said at least one line of contact advances.

8. The method of claim 7 wherein the step of progressively advancing the at least one line of contact comprises unflexing said at least one of the substrate and the stamp in a way such that said at least one of the substrate and the stamp flattens as it unflexes.

9. The method of claim 7 wherein said at least one of the substrate and the stamp is flexed axially to form a convex surface.

10. The method of claim 7 wherein the flexural rigidity of said at least one of the substrate and the stamp is such that flexing said at least one of the substrate and the stamp results in substantially distortion-free transfer of said feature pattern.

11. The method of claim 7 wherein the step of flexing at least one of the substrate and the stamp comprises the step of flexing the substrate.

12. The method of claim 11 wherein said substrate is a polyester film.

* * * * *